(12) United States Patent
Easton

(10) Patent No.: US 6,779,726 B1
(45) Date of Patent: Aug. 24, 2004

(54) METHOD AND APPARATUS FOR CONTROLLING A PRODUCTION OPERATION USING PRINTED INFORMATION ON A COMPONENT TAPE

(75) Inventor: Mark Easton, Fife (GB)

(73) Assignee: Solectron Corporation, Milpitas, CA (US)

( * ) Notice: Subject to any disclaimer, the term of this patent is extended or adjusted under 35 U.S.C. 154(b) by 0 days.

(21) Appl. No.: 09/432,545

(22) Filed: Nov. 3, 1999

(51) Int. Cl.$^7$ ................................................ G06K 7/10
(52) U.S. Cl. .................... 235/462.01; 29/701; 700/213; 700/214; 700/215
(58) Field of Search ....................... 235/462.13, 462.14, 235/375–376, 462.08, 462.09, 462.01; 29/739–740, 720, 832, 701, 709, 593; 271/298; 422/63, 65, 67; 700/213–215, 218; 101/35–37, 84, 72; 318/568.21; 206/713, 701

(56) References Cited

U.S. PATENT DOCUMENTS

| | | | |
|---|---|---|---|
| 2,066,179 A | 12/1936 | Keller | ......................... 101/219 |
| 3,885,749 A | 5/1975 | Skacel | ....................... 242/56 A |
| 3,941,981 A | 3/1976 | Abe et al. | .................. 235/92 V |
| 4,029,006 A | 6/1977 | Mercer | ......................... 101/35 |

(List continued on next page.)

FOREIGN PATENT DOCUMENTS

| | | | | |
|---|---|---|---|---|
| GB | 2140383 A | 11/1984 | ........... | B65D/73/02 |
| JP | 02 139367 | 5/1990 | ........... | B65D/73/02 |
| JP | 02 152673 | 6/1990 | ........... | B65B/73/02 |
| JP | 05 198968 | 8/1993 | .......... | H05K/13/02 |
| JP | 07 249891 | 9/1995 | .......... | H05K/13/02 |
| JP | 10 150293 | 6/1998 | .......... | H05K/13/02 |

OTHER PUBLICATIONS

BarCodeUSA.com, background info., printed from website "www.barcodeusa.com/barcode_1(thru 30).htm", printed Jul. 18, 1999, 40 pages.

(List continued on next page.)

*Primary Examiner*—Diane I. Lee
*Assistant Examiner*—Lisa Caputo
(74) *Attorney, Agent, or Firm*—Paul Davis; Heller, Ehrman, White & McAuliffe

(57) ABSTRACT

A production operation is controlled by electronically scanning and reading printed information at intervals along a component tape. The printed information is continuously scanned and read from the carrier tape portion or the cover tape portion of the component tape as components are removed from the component tape during a production operation. In a production facility, the data from many component tapes is transmitted simultaneously to a production control system where all data is processed. The processed data is used to automatically control a production operation by using the printed information to control resources of the production operation, resources including component inventory, equipment, and facilities. Applications controlled by the printed component tape information include automatic production initial set-up verification, automatic production feed change set-up verification, feeder performance verification, material monitoring including automatic backflushing and stock check/work-in-process cycle counting, and production system control.

30 Claims, 12 Drawing Sheets

U.S. PATENT DOCUMENTS

| | | | | |
|---|---|---|---|---|
| 4,135,447 A | | 1/1979 | Barnes et al. | 101/177 |
| 4,298,120 A | | 11/1981 | Kaneko et al. | 206/329 |
| 4,317,989 A | | 3/1982 | Sargent | 235/92 DN |
| 4,354,337 A | | 10/1982 | Mori et al. | 53/559 |
| 4,370,665 A | | 1/1983 | Scranton et al. | 346/75 |
| 4,415,765 A | | 11/1983 | Iwasa et al. | 174/72 A |
| 4,610,083 A | | 9/1986 | Campisi et al. | 29/832 |
| 4,691,112 A | | 9/1987 | Wydler | 250/570 |
| 4,703,329 A | | 10/1987 | Allen et al. | 346/24 |
| 4,703,765 A | | 11/1987 | Paules et al. | 131/112 |
| 4,709,379 A | | 11/1987 | Siemer | 377/3 |
| 4,756,012 A | | 7/1988 | French, III | 377/8 |
| 4,756,073 A | | 7/1988 | Hawkswell | 29/564.6 |
| 4,865,895 A | | 9/1989 | Vlamings et al. | 428/98 |
| 4,934,891 A | | 6/1990 | Hawkswell | 414/223 |
| 4,937,511 A | * | 6/1990 | Herndon et al. | 318/568.21 |
| 5,235,164 A | | 8/1993 | Noyama et al. | 235/375 |
| 5,242,053 A | | 9/1993 | Rowe | 206/446 |
| 5,294,942 A | | 3/1994 | Loewenthal et al. | 346/107 R |
| 5,299,902 A | | 4/1994 | Fujiwara et al. | 414/416 |
| 5,322,380 A | | 6/1994 | Crocker | 400/124 |
| 5,339,939 A | * | 8/1994 | Gueble et al. | 198/345.2 |
| 5,419,802 A | | 5/1995 | Nakatsuka et al. | 156/584 |
| 5,456,001 A | | 10/1995 | Mori et al. | 29/739 |
| 5,478,997 A | | 12/1995 | Bridgelall et al. | 235/462 |
| 5,504,316 A | | 4/1996 | Bridgelall et al. | 235/462 |
| 5,525,788 A | | 6/1996 | Bridgelall et al. | 235/462 |
| 5,562,384 A | | 10/1996 | Alvite et al. | 414/222 |
| 5,588,614 A | | 12/1996 | Takada et al. | 242/538 |
| 5,608,202 A | | 3/1997 | Bridgelall et al. | 235/462 |
| 5,637,856 A | | 6/1997 | Bridgelall et al. | 235/472 |
| 5,692,292 A | | 12/1997 | Asai et al. | 29/740 |
| 5,694,443 A | | 12/1997 | Stone et al. | 377/6 |
| 5,725,140 A | | 3/1998 | Weber et al. | 226/139 |
| 5,729,963 A | | 3/1998 | Bird | 53/471 |
| 5,751,303 A | | 5/1998 | Erickson et al. | 347/16 |
| 5,756,981 A | | 5/1998 | Roustaei et al. | 235/462 |
| 5,839,836 A | | 11/1998 | Yuyama et al. | 400/62 |
| 5,914,477 A | | 6/1999 | Wang | 235/462.1 |
| 5,933,349 A | * | 8/1999 | Dalgleish et al. | 700/121 |
| 5,947,525 A | | 9/1999 | Pollman | 283/36 |
| 5,956,925 A | * | 9/1999 | Ruble, III | 53/428 |
| 6,332,536 B2 | * | 12/2001 | Easton | 206/459.5 |
| 6,341,726 B1 | * | 1/2002 | Castanedo et al. | 235/462.13 |

OTHER PUBLICATIONS

"One–Dimensional (Linear) Barcode Symbologies", printed from website "www.aimi.org/techinfo/barcode/1Dsymb.htm", printed Jul. 18, 1999, last updated Jul. 13, 1998, 2 pages.

"Two dimensional (2D) Barcode Symbologies", printed from website "www.aimi.org/techinfo/barcode/2Dsymb.htm", printed Jul. 18, 1999, last updated Jul. 3, 1998, 2 pages.

"Barcode Printing", printed from website "www.aimi.org/techinfo/barcode/bcprint.htm", printed Jul. 18, 1999, last updated Jul. 13, 1998, 1 page.

"Barcode Scanning", printed from website "www.aimi.org/techinfo/barcode/scanning.htm", printed Jul. 18, 1999, last updated Jul. 13, 1998, 2 pages.

"BarCode 1—2–Dimensional Bar Code Page", Adams Communications, printed from website "www.adams1.com/pub/russadam/stack.html", printed Jul. 18, 1999, last updated Apr. 6, 1999, 11 pages.

"Optical Character Recognition (OCR)", printed from website "www.aimi.org/techinfo/ocr/ocrtech.html", printed Jul. 18, 1999, last updated Jul. 13, 1998, 3 pages.

"Optical Mark Recognition (OMR)", printed from website "www.aimi.org/techinfo/ocr/ocrtech.htm", printed Jul. 18, 1999, last updated Jul. 13, 1998, 2 pages.

"Machine Vision Technology", printed from website "www.aimi.org/techinfo/vision/vision.htm", printed Jul. 18, 1999, last updated Jul. 13, 1998, 4 pages.

"Radio Frequency Data Communications", printed from website "www.aimi.org/techinfo/rfdc/rfdc.htm", printed Jul. 18, 1999, last updated Jul. 13, 1998, 6 pages.

"Magnetic Ink Character Recognition", printed from website "www.aimi.org/techinfo/micr/micrtech.htm", printed Jul. 18, 1999, last updated Jul. 13, 1998, 2 pages.

* cited by examiner

METHOD AND APPARATUS FOR CONTROLLING A PRODUCTION OPERATION USING PRINTED INFORMATION ON A COMPONENT TAPE

BACKGROUND OF THE INVENTION

1. Field of the Invention

This invention relates to the field of automatic assembly of electronic devices. In particular, the invention relates to counting electronic components on a component tape and printing a sequential count on the cover tape.

2. Description of the Related Art

Companies in the electronics manufacturing services (EMS) industry are constantly presented with the need to determine the inventory of parts currently available for production of complicated machinery and electrical devices and printed circuit board assemblies (PCBAs). Miniaturization of electronic circuits and parts in the electronics and electrical-mechanical arts has evolved to the point where many of the parts used in devices such as calculators, computers, pagers, telephones, and watches are difficult to store and handle when the parts are in inventory or are being used in conjunction with a mass production line utilizing a large supply of components.

Many of the electrical parts, as an example, are so tiny that they are stored on tapes, which are then rolled onto supply reels for handling. The electrical parts may be encapsulated on the surface of a storage tape by providing a cavity on the storage tape over which another tape is placed in order to capsulate or capture the tiny part and protect the parts from damage or destruction. The component dispensing tape is usually provided in reel form, with a single reel having many feet of tape. Depending on the density of component carriers in the tape, such a reel may contain thousands of components.

Along one side of the typical component dispensing tape are tractor drive or index holes. The automated assembly equipment generally includes a toothed drive wheel that advances the tape by engagement with these holes. The spacing between the holes corresponds to the spacing between the carrier compartments so that when the tape is advanced a particular predetermined number of holes, a number of components are advanced, usually to a robotic assembly arm for placement on a circuit board.

In order to better manage component supply and demand, it is desirable to provide each assembly station with only the number of components that are expected to be used in a certain product run or in a certain period of time. As many of the components are individually quite valuable, a manufacturer must keep a running account of the number of such parts in inventory for tracking material flow, reducing waste, and preventing disruptions in daily production line operation. The physical problem of handling the total number of such small parts is extremely difficult from a bulk handling point of view. As a result, the encapsulating storage tapes become a useful method for maintaining these parts in inventory.

The component tapes protect the components and provide a supply reel of sufficient size for handling by employees. On the other hand, such storage complicates the problem of counting parts for the purpose of identifying a total number of such parts in inventory. Furthermore, the small size of these parts becomes a burden when the parts are placed on a manufacturing line where they are used at a rapid pace.

Also, it is imperative that the assembly operation maintain a running inventory of parts available to the manufacturing process at all times. Many electronic units contain literally thousands of tiny parts for inclusion in a single finished electrical unit. If one of these parts is exhausted during the manufacturing process, then the entire manufacturing line may be shut down until the exhausted parts can be replaced. Consequently, a manufacturer is burdened with the problem of keeping a running inventory of the number of parts available during the continuous manufacturing of larger electrical units.

A variety of methods are used to track the storage and manufacturing inventory of small parts, including weight, component tape measuring, and component counting methods. Using the weight method, some inventory systems rely on weight as a way of measuring the total number of small items in inventory. Each unit has a known weight, which can be used to calculate the number of units from a total weight of a bulk container of such small units. The disadvantage of this weight determination system is that expensive electronic scales must be used to make the weight checks. Furthermore, these electronic scales are subject to variations in weight measured and therefore must be constantly recalibrated. Also, weight counting systems are not particularly useful or efficient in a continuous manufacturing process. Some of these weight systems have variations caused by environmental conditions, for example heat and dust, and packaging variables which tend to result in erroneous weight calculations, thereby resulting in an erroneous calculation as to the number of tiny parts in inventory.

In component tape measuring methods, the length of component tape needed to supply a desired number of components to an assembly station may be determined manually. Since counting each of the desired number of components is impractical, the number of components in a short length of the tape is counted instead. The length of tape required for a particular assembly run is then estimated based on the component density of the sampled length of tape, taking into account the occurrences of empty carrier compartments in the sampled tape. The desired length of tape is then unrolled, measured and cut Although somewhat wasteful of components, the tape is generally cut slightly longer than the computed length to ensure that the equipment does not prematurely exhaust the component supply before the corresponding assembly run is completed.

Component counting includes three typical methods for counting reel quantities of electronic components: reel count, gauge, and estimation methods. The accuracy of these methods varies, but they each have numerous disadvantages.

The reel count method, while having an approximate accuracy of 99%, is slow and has a risk of higher attrition. Reel count also exhibits a lack of counters while being immobile. Furthermore, it is time consuming, requires a great deal of training in operation, and is highly susceptible to human setup error.

The disadvantages of the gauge method are that, while there are over 50 possible variants, not every reel type is covered. This method also requires training to operate accurately and is subject to human error in the identity of the reel type, packaging type, and correct components. The gauge method is also subject to estimation error.

As the most commonly used method of counting reel quantities, the estimation method is very inaccurate, even with training. Human error inheres in the inconsistent visual clues. Moreover, the estimation error trend is to underestimate the quantities on almost full reels while overestimating the quantities on almost empty reels.

The adverse effects of the typical counting and tracking methods are numerous. For example, material flow cannot be accurately tracked. This results in backflushing the quantity of material assumed used in production. As production often consumes only part of a reel, this means a significant amount of stock is wasted. Furthermore, an estimated quantity of attrition called autoscrap is added in an attempt to keep the stock accurate. Work in progress (WIP) cycle counting is then used to verify or correct the stock data. The typical error of over one million parts in WIP indicates that this stock check technique is slow and inaccurate. A typical WIP cycle count has an absolute accuracy level of 30%, meaning that the post-hoc material tracking process is very time consuming and, consequently, ineffective. As planning, purchasing, manufacturing, and customer commitment decisions are based on the material integrity, they are adversely affected. Furthermore, poor data integrity causes disruptions in daily production line operation and results in slow kitting times. Consequently, there is a need for a method and apparatus for determining and printing an electronic component count on the component tape and using the count information to increase the efficiency of the production process.

SUMMARY OF THE INVENTION

A method and apparatus for controlling a production operation are provided. Printed information is electronically scanned and read at intervals along a component tape. The printed information may be continuously scanned and read from the carrier tape portion or the cover tape portion of the component tape as components are removed from the component tape during a production operation or at the end of a production run. In a production facility, many component tapes are scanned and read simultaneously, and the data from each tape is transmitted to a production control system where all data is processed. The data processed from the printed information is used to automatically control a production or assembly operation by using the printed information to control resources of the production operation, resources including component inventory, equipment, and facilities. Applications controlled by the printed component tape information include automatic production initial set-up verification, automatic production feed change set-up verification, feeder performance verification, material monitoring including automatic backflushing and stock check/work-in-process cycle counting, and production system control. Production records are generated using the data processed from the printed information on the component tape.

The descriptions provided herein are exemplary and explanatory and are intended to provide examples of the claimed invention.

BRIEF DESCRIPTION OF THE FIGURES

The accompanying drawings illustrate embodiments of the claimed invention. In the drawings:

DETAILED DESCRIPTION OF THE INVENTION

A variety of component tape printers are described herein that count components on a component tape. These printers also print information including the component count on a portion of the tape at intervals along the component tape. The printed information on the component tape is used to control a production operation by electronically scanning and reading the printed information and using components of the information to automatically control production equipment and devices. In this manner, the component tape printer provides an advantage to EMS industry companies by providing higher stock turns, improving the supply of printed circuit boards to mainline production, improving stock check accuracy, providing for accurate and automatic material backflushing, providing accurate information to action problem areas, and providing 100% surface-mount device (SMD) material integrity. These and other advantages may result in improved decision making with an improved ability to meet customer commitments, thereby raising customer satisfaction and employee satisfaction.

Figure 1:
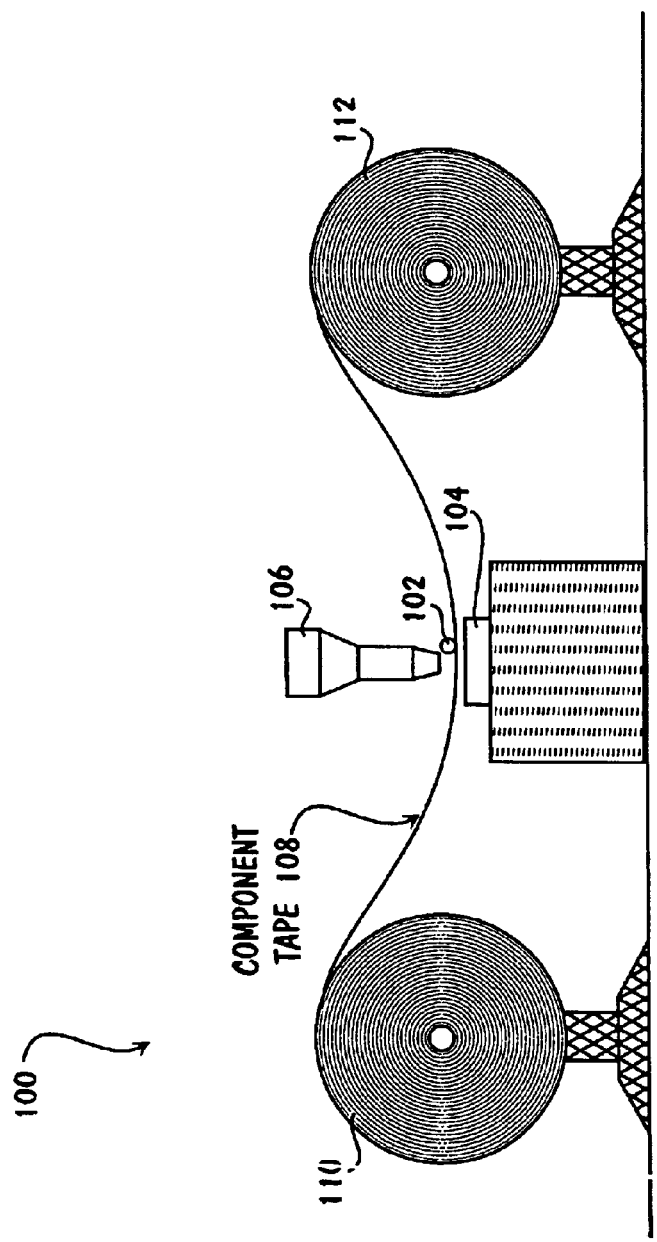
FIG. 1 is a component tape printer of an embodiment.

FIG. 1 is a component tape printer 100 provided in accordance with one aspect of the invention that includes a feeder 102, a counter 104, and a printer 106. The feeder 102 transfers the component tape 108 from and to a component tape reel 110. A take-up reel 112 may be used to receive the component tape 108 from the component tape reel 110, but the embodiment is not so limited. The counter 104 is a component reel counter that counts the electronic components stored on the component tape 108. The counter 104 is capable of differentiating between full and empty pockets of the component tape 108. Furthermore, the counter 104 is capable of identifying the beginning and the end of a length of component tape 108.

The printer 106 prints information on the component tape 108 at specified intervals along the component tape 108. The counting and printing are performed during the transfer process. The printed information can be printed on the carrier tape portion or the cover tape portion of the component tape 108. The printed information may include any information relating to the particular components, for example specification data, tolerance data, and manufacturing information, and the information may be encoded. In an embodiment, the printed information includes a count of electronic components where the count indicates the position of the corresponding electronic components on the component tape 108. As the electronic components are susceptible to electrostatic charge, the component tape printer 100 is protected from electrostatic discharge (ESD).

Figure 2:
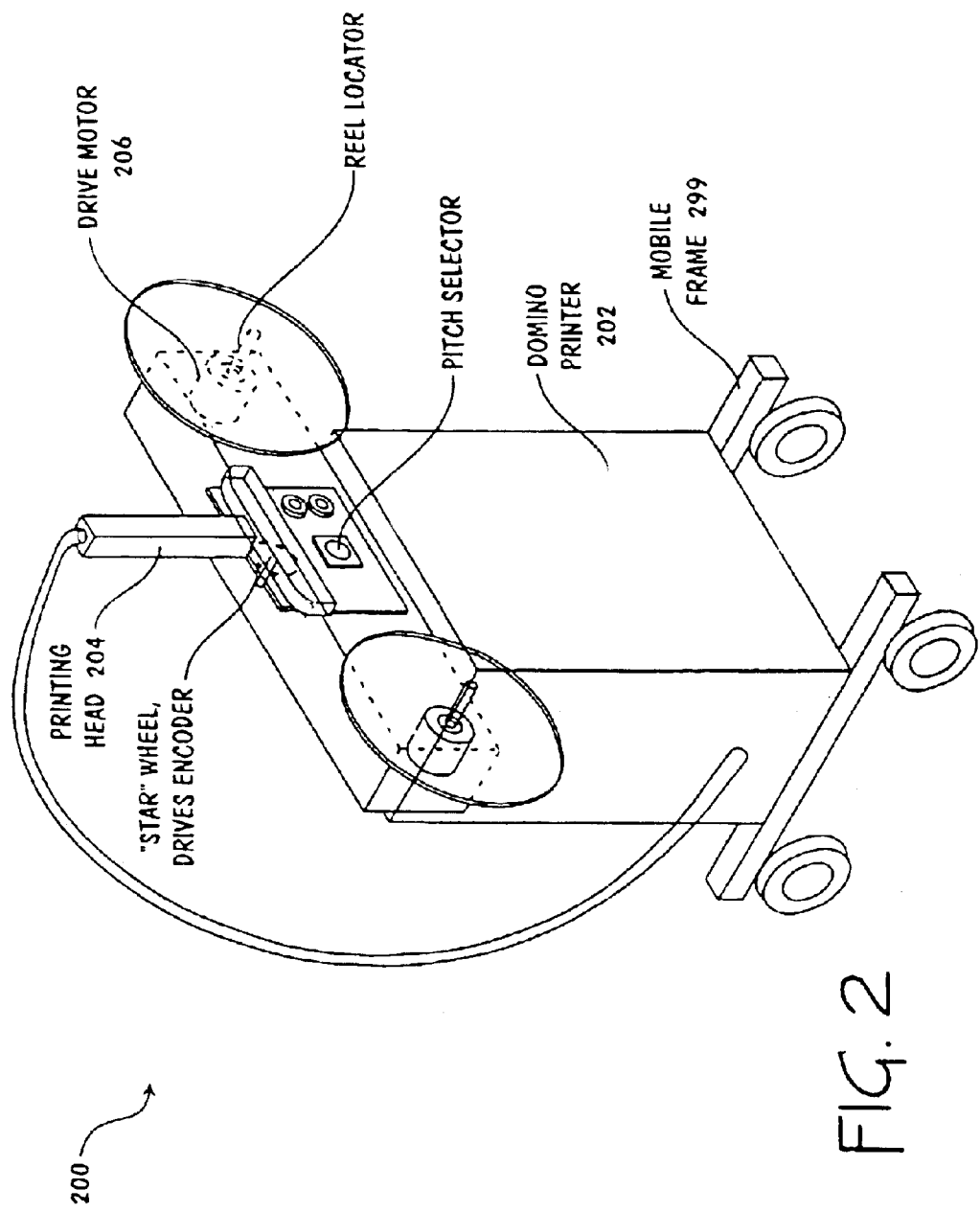
FIG. 2 is an isometric drawing of a component tape printer of an embodiment.

The component tape printer 100, while generally including the functionality of a feeder 102, counter 104, and printer 106, uses a number of specific components. FIG. 2 is an isometric drawing of a component tape printer 200 of an embodiment. While not so limited, the components of the component tape printer 200 are as follows: one motion controller; two stepper drive boards; two stepper motors 206; one encoder; one 24-volt power supply; one inlet/filter; one switch; one high-speed ink jet printer 202; one 3m-60 micron head 204; one Domino 1L7HQ60 font; one 270BK ink system; one peltier kit; one RS232 kit; and, communication software. The motion controller is coupled to the printer 202 using a serial link over which printing data is downloaded. The component tape printer may be housed on a mobile frame 299, but is not so limited.

The component tape printer of an embodiment may be integrated with or used in combination with a variety of other equipment of the component processing, manufacturing, and assembly process. For example, the component tape printer may be integrated with, used in combination with, or coupled to manual taping machines and automatic taping machines. Furthermore, the component tape printer may be integrated with, used in combination with, or coupled to automatic component handing systems that integrate component making, inspection, and testing. Moreover, the component tape printer may be integrated with, used in combination with, or coupled to an integrated taper, parts counter, and peel force tester. Additionally, the component tape printer may be integrated with, used in combination with, or coupled to a peel force tester.

Figure 3:
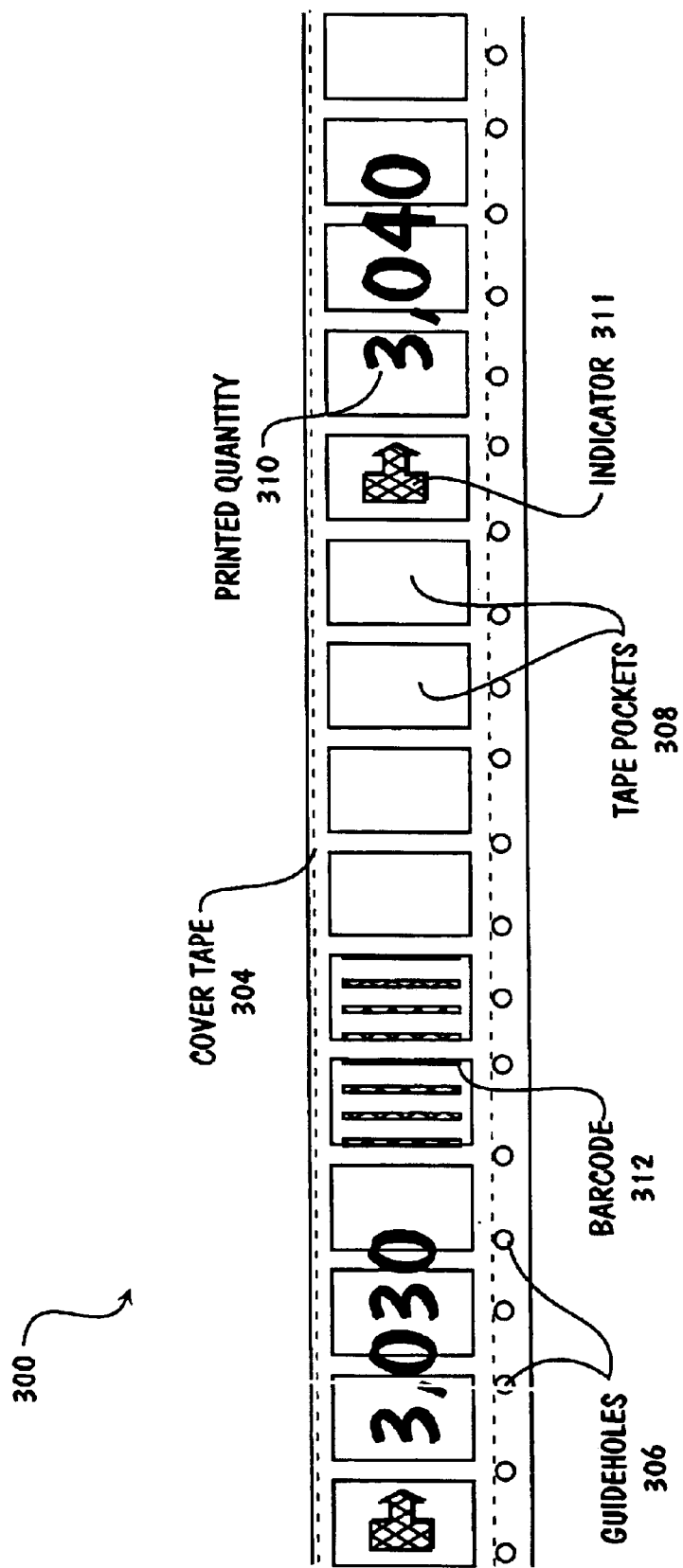
FIG. 3 is a top view of a component tape of an embodiment including a component count.
Figure 4:
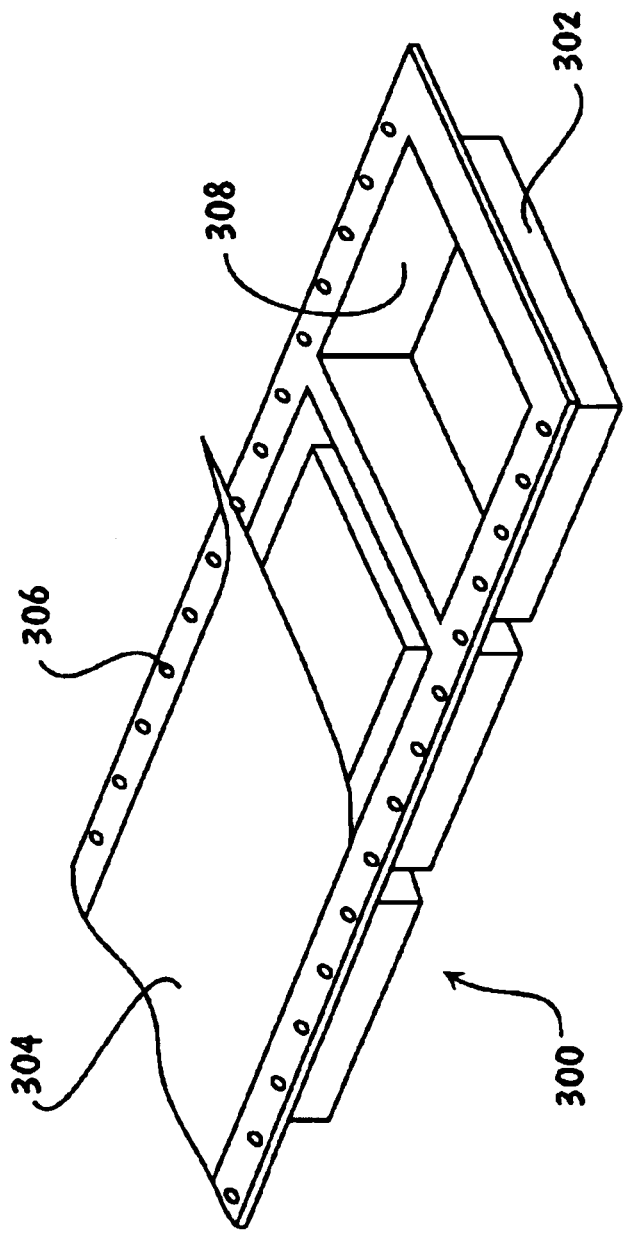
FIG. 4 is an alternate view of a component tape of an embodiment.

FIG. 3 is a top view of a component tape 300 of another embodiment of the invention. FIG. 4 is an alternate view of a component tape 300. The component tape 300 may accomodate surface-mount devices (SMDs), or components, radial components, and axial components, but is not so limited. Paper and plastic SMD component tape is supported in a variety of sizes. While supporting any width and step variant of component tape, the width and step variant of component tape supported in an embodiment varies from 8 millimeter (mm) to 56 mm in steps of 8, 12, 16, 24, 32, 44, and 56. While supporting any pitch and step variant of component tape, the pitch and step variant of component tape supported in an embodiment varies from 2 millimeter (mm) to 36 mm in steps of 2, 4, 8, 12, 16, 24, 32, and 36. While supporting any depth variant of component tape, component tape having a depth up to 10 mm is supported in an embodiment. While supporting any component reel diameter variant of component tape, component reel diameters up to 75 mm are supported in an embodiment.

The component tape 300 of an embodiment includes a carrier tape 302 and a cover tape 304, but is not so limited. The carrier tape 302 is useful for the storage and delivery of components by an advancement mechanism. The components may be electronic components, but are not so limited. The carrier tape 302 is a unitary flexible carrier tape having a strip portion defining a top surface and a bottom surface opposite the top surface. The strip portion includes longitudinal edge surfaces, and a row of aligned advancement holes 306, or guide holes, formed in and extending along one, and possibly both, edge surfaces. The advancement holes 306 provide a means for receiving an advancement mechanism such as the teeth of a sprocket drive for advancing the carrier tape toward a predetermined location. Depending upon the size and type of components carried by the component tape 300, and the type of carrier tape 302 used, the cover tape 304 may not be used.

One type of carrier tape 302 includes a series of pockets 308 formed in and spaced along the strip portion of the carrier tape 302. The pockets 308 open through the top surface of the strip portion, but are not so limited. Within a given carrier tape 302, each pocket 308 is usually essentially identical to the other pockets. Typically, the pockets 308 are aligned with each other and equally spaced apart. Each pocket 308 may include four side walls, each at generally right angles with respect to each adjacent wall. Side walls adjoin and extend downwardly from the top surface of the strip portion and adjoin the bottom wall to form a pocket. The bottom wall is generally planar and parallel to the plane of the strip portion. The bottom wall may include an aperture or through hole that is sized to accommodate a mechanical push-up to facilitate removal of a component that is stored in pocket. The aperture may also be used by an optical scanner to detect the presence or absence of a component within any given pocket. In addition, the aperture may be useful in applying a vacuum to the pocket to permit more efficient loading of the pockets with components.

The pockets 308 of the carrier tape 302 may be designed to conform to the size and shape of the components that they receive. However, the pockets 308 may also be designed so that a single pocket 308 of generic design may readily accommodate components of widely varying size and shape. The pockets 308 may have side walls of various dimensions; however, in general, each pocket includes at least one side wall that adjoins and extends downwardly from strip portion, and a bottom wall that adjoins the side wall to form the pocket 308. Thus, the pockets 308 may be circular, oval, triangular, pentagonal, or have other shapes in outline. Each side wall may also be formed with a slight draft in order to facilitate insertion of the component, and to assist in releasing the pocket from a mold or forming die during fabrication of the carrier tape 302. The depth of the pocket 308 can also vary depending on the component that the pocket 308 is intended to receive. In addition, the interior of the pocket 308 may be formed with ledges, ribs, pedestals, bars, rails, appurtenances, and other similar structural features to better accommodate or support particular components. Although one embodiment has a single column of pockets, two or more columns of aligned pockets could also be formed along the length of the strip portion in order to facilitate the simultaneous delivery of multiple components.

The strip portion of the carrier tape 302 of an embodiment may be formed of any paper or polymeric material that has a sufficient gauge and flexibility to permit the material to be wound about the hub of a component reel, or storage reel. A variety of polymeric materials may be used including, but not limited to, polyester, polycarbonate, polypropylene, polystyrene, polyvinyl chloride, and acrylonitrile-butadiene-styrene. The carrier tape 302 may also be an embossed tape. The strip portion may be optically clear, pigmented, or modified to be electrically dissipative. In the latter case, the strip may include an electrically conductive material, such as carbon black or vanadium pentoxide, that is either interspersed within the polymeric material or is subsequently coated onto the strip. The electrically conductive material allows an electric charge to dissipate throughout the carrier tape and preferably to the ground. This feature may prevent damage to components contained within the carrier tape due to an accumulated static electric charge.

The carrier tape 302 may include an elongate cover tape 304. When the carrier tape 302 includes pockets 308, the cover tape 304 is applied over the pockets 308 of the carrier tape 302 to provide an additional method of retaining the components. The cover tape 304 can also protect the components from dirt and other contaminants that could invade the pockets 308. The cover tape 304 is flexible, overlies part or all of the pockets 308, and is disposed between the rows of advancement holes 306 and along the length of strip portion of the carrier tape 302, but is not so limited. The cover tape 304 is releasably secured to the top surface of strip portion so that it can be subsequently removed to access the stored components. The cover tape 304 includes parallel longitudinal bonding portions that are bonded to longitudinal edge surfaces of the strip portion. For example, a pressure sensitive adhesive such as an acrylate material, or a heat-activated adhesive such as an ethylene vinyl acetate copolymer, can be used to adhere the cover to edge surfaces. Alternatively, the cover tape 304 can be secured to the strip portion by a mechanical fastener such as a snap fit interference fastener or a hook and loop fastener, with the hooks being carried by either the cover or the strip portion and the loops being carried by the other.

In an embodiment, the bottom wall of the pockets 308 may include a ring of adhesive. The adhesive provides a means for securely retaining components in the pockets 308. As a result, a single pocket 308 having a generic design can be used to accommodate components of widely varying shape and size since the adhesive provides a means for retaining the component in the pocket 308. Consequently, pockets 308 need not be shaped to closely receive the component nor must the pockets 308 be sized to match a particular component. The shape and the placement of the adhesive may take on a variety of configurations.

The component tape 300 includes information 310–312 printed on a portion of the component tape 300. In an embodiment, the printed information 310–312 is printed on the cover tape 304. In an alternate embodiment, the printed information 310–312 may be printed on the carrier tape 302. In another alternate embodiment, the printed information 310–312 may be printed on the carrier tape 302 and the cover tape 304, with the same information printed in the same format on both the carrier tape 302 and the cover tape 304. In still another alternate embodiment, the printed information 310–312 may be printed with a first portion of the information on the carrier tape and a second portion of the information on the cover tape. In yet another alternate embodiment, printed information in a first format, for example a barcode format, can be printed on a first portion of the component tape 300, for example the cover tape, while printed information in a second format, for example an alphanumeric format, can be printed on a second portion of the component tape 300, for example the carrier tape.

The printed information 310–312 includes a count or quantity 310 of electronic components on a component tape 300 where the count 310 at a particular location on the component tape 300 indicates the position of the corresponding electronic component on the component tape 300. An indicator 311 is printed along with each quantity count 310 that indicates which component position of the tape 300 corresponds to the printed count 310. The printed information 310–312 may also include a variety of information associated with the components, information comprising part number, tolerance and value description, batch number, lot number, component manufacturer, and component vendor.

The printed information 310–312 may be produced by direct marking, as with laser etching or printing, or by imaging. The printing includes ink jet printing and laser printing. The component tape printer of an embodiment supports printing that is compatible with reading and scanning technologies including, but not limited to, Optical Character Recognition (OCR) technology, Optical Mark Recognition (OMR) technology, reading by infrared scanners, and Magnetic Ink Character Recognition (MICR) technology. Furthermore, the component tape printer supports printing that is compatible with machine vision technology including linear imagers, laser imagers, and charge coupled device (CCD) cameras or other visual image sensors.

The print type used to print the information includes alphanumeric characters and Automatic Identification and Data Capture (AIDC) technologies, for example barcodes 312. The AIDC technologies that may be used are varied and include one-dimensional barcodes, two-dimensional barcodes, Composite Symbology, Reduced Space Symbology (RSS) barcodes, three-dimensional multi-color superimposed symbologies, and Radio Frequency Identification. Combinations of different AIDC technologies may be used, as well as combinations including AIDC technologies and alphanumeric characters.

One-dimensional, or linear, barcodes are formed from a series of varying-width parallel dark bars and light spaces. The one-dimensional barcodes that may be accomodated in an embodiment include, but are not limited to: Universal Product Code (UPC) including UPC-A and UPC-E; European Article Numbering (EAN) system codes including EAN-13 and EAN-8; Interleaved 2 of 5 (ITF); Codabar; Code 39; Code 128; LOGMARS; Code 93; Code 11; Plessy code; Matrix 2 of 5; Nixdorf Code; Postnet; 4-state Code; Industrial 2 of 5; Standard 2 of 5; and, MSI.

Two-dimensional, or multi-row, barcodes provide a means of storing large amounts of data in a very small space. Two types of two-dimensional barcode in use that are supported by an embodiment include stacked symbologies and matrix symbologies. The two-dimensional barcodes that may be accomodated in an embodiment include, but are not limited to: Aztec Code; Small Aztec Code; CP Code; Code One; Code 16K; Code 49; DataGlyph; DataMatrix; MaxiCode; MiniCode; Portable Data File 417 (PDF417); MicroPDF417; Quick Response (QR) Code; SuperCode; Ultracode; 3-DI; ArrayTag; Codablock; Datastrip Code; Dot Code A; hueCode; SmartCode; Snowflake Code; and, Ultracode.

Composite symbology incorporates a linear component with a two-dimensional composite component. The composite symbologies that may be accomodated in an embodiment include, but are not limited to: EAN.UCC Composite symbol; Aztec Mesas; 93i Symbology; and, Code 128.

Figure 5:
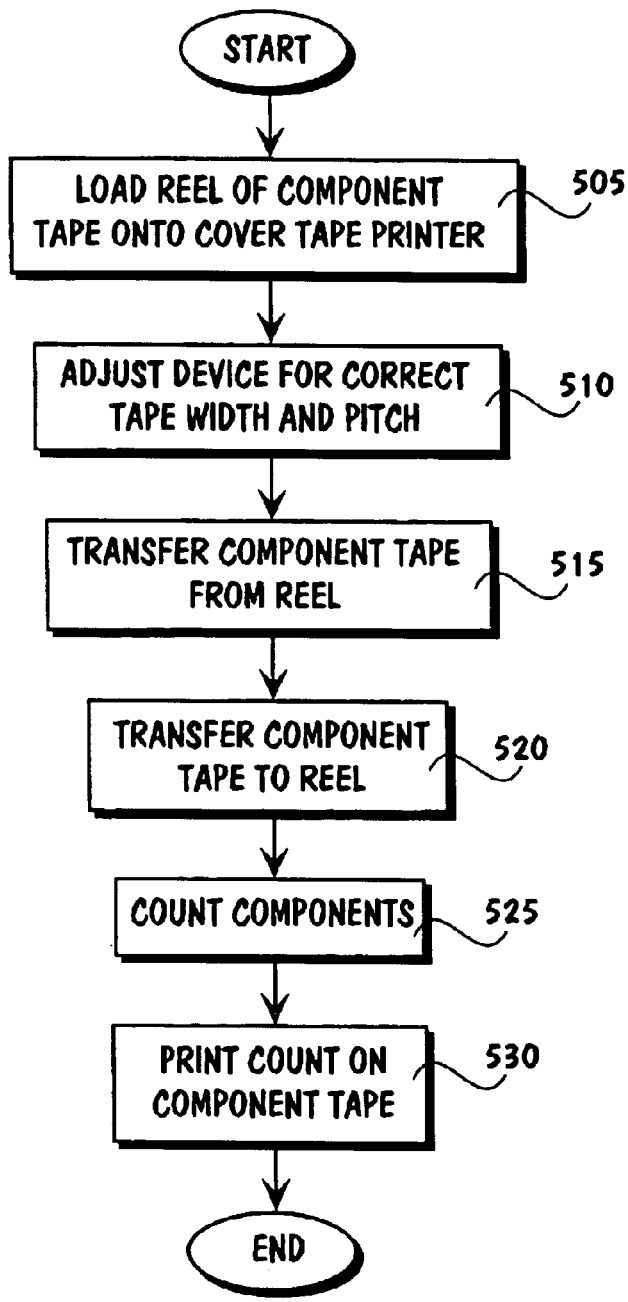
FIG. 5 is a flowchart of a method for determining and printing a component count of an embodiment.

FIG. 5 is a flowchart of a method for determining and printing a component count of an embodiment. Operation begins at step 505, at which a component reel containing a component tape is loaded onto the component tape printer of an embodiment. The component tape may contain electronic components, but is not so limited. The component tape printer is adjusted to accomodate the component tape dimensions, at step 510. The component tape is transferred from the component reel, at step 515, and transferred back to the component reel, at step 520. The electronic components on the component tape are counted, at step 525.

The component count, at prespecified intervals, is printed on the component tape along with a corresponding indicator indicating a particular component that is associated with a particular value of the count, at step 530. The printed component count represents the position of the corresponding component on the component reel. The beginning number for the count, the beginning position on the component tape, and the count interval are preselected and prespecified. For example, the components of an embodiment are numbered starting from the center of the component reel with a component count printed at intervals of 10, but are not so limited. Therefore, if printing is accomplished on a component tape containing 5000 components, component number one is located at the center of the component tape reel and component number 5000 is located at the end of the component tape reel. As another example, component number 5000 is located at the center of the component tape reel and component number one is located at the end of the component tape reel.

A number of alternate embodiments exist for determining and printing a component count. A first alternate embodiment performs both the counting and the printing as the component tape is transferred from the component reel. A second alternate embodiment performs the counting as the component tape is transferred from the component reel, and performs the printing as the component tape is transferred back to the component reel. Another alternate embodiment performs both the counting and the printing as the component tape is transferred to the component reel.

A number of counting techniques are supported for counting the components of the component tape. In an embodiment, the advancement holes, or guide holes, of the component tape are used to calculate the number of components using a standard relationship between the number of advancement holes per component for each size of component tape. An alternate embodiment determines a number of components using a number of components per a unit length of component tape. The number of components per unit length of component tape may be automatically determined or may be preprogrammed, but the embodiment is not so limited. Another alternate embodiment uses machine vision subsystems to count the components of the component tape.

In using the advancement holes to calculate the number of components, an embodiment uses a spindle to pull the carrier tape through the cover tape printer using the guide holes. The spindle is coupled to an encoder, and the encoder counts the number of guide holes as the spindle rotates. The count is based on the relationship between the spindle rotations, the guide holes, and the component placement on the component tape. The counting device is set to the specified starting value prior to advancing the component tape. The counting and printing is initiated with the first component or pocket on the component tape, and printing continues at the specified interval until the end of the component tape is reached.

In using the advancement holes to calculate the number of components, an alternate embodiment of the component tape printer includes a surface mounted device parts counter apparatus having a guide track and first and second detectors. The guide track positions the component tape in a desired orientation as the tape moves through the component tape printer. A first detector, or index hole detector, is positioned for detecting advancement holes in the carrier tape when the tape moves through the guide track. A second detector, or sense hole detector, is positioned for detecting sense holes, indicative of empty carrier compartments, when the carrier tape moves through the guide track.

The outputs from the first and second detectors are fed to a counter circuit through a logic circuit The counter typically counts index holes as they are detected by the first detector. When, however, the second detector detects an empty carrier compartment, a logic circuit inhibits the counter from counting the next index hole. Thus, the total count accumulating in the counter equals the number of index holes detected less the number of empty carrier compartments detected. This count equals the number of full component carrier compartments that have passed the first and second detectors.

The first and second detectors may be photoelectric source and detector pairs positioned for detecting optical continuity through index holes and sense holes, respectively. The photoelectric sources can comprise simple light emitting diodes. The photoelectric detectors can comprise phototransistor circuits.

The phototransistor circuits may include a potentiometer for adjusting the sensitivity of the circuit. This adjustment provides a way to adjust the sensitivity of the photodetectors in order to optimize performance of the apparatus with tapes of differing optical qualities. For example, if the tape is optically translucent, the sensitivity of the photodetectors may be reduced in order to prevent the photodetectors from sensing light passed through the tape itself. In alternative embodiments, the sensitivity of the photodetectors can be varied by varying the intensity of light emitted by the photoelectric sources. Such an alternative system comprises a potentiometer for varying the current through the light emitting diode.

When the carrier tape is formed from a clear plastic, the index hole photodetector may not be able to optically distinguish between an index hole and the intervening clear tape. The clear tape is accomodated by changing the sense hole photodetector utility from detecting optical continuity, indicative of an empty carrier compartment, to detecting optical discontinuity, indicative of a full carrier compartment. The number of optical interruptions detected by the sense hole photodetector as the tape is advanced through the apparatus thus corresponds to the number of components carried by the tape. Accordingly, to count components in an optically transmissive tape, the counter is arranged so that it counts optical discontinuity signals from the sense hole photodetector.

The counter apparatus of an embodiment automatically detects whether the component tape is optically opaque or transmissive. This is done by monitoring the output from the index hole photodetector. If the output from this photodetector continuously indicates optical continuity, it is determined that an optically transmissive tape is being used. If, however, the output signal from the index hole photodetector occasionally indicates optical discontinuity, it is determined that an opaque tape is being used.

Component tapes containing printed component information as described herein are used to control a production or assembly operation by using the printed information to control resources of the production operation, resources including components, equipment, and facilities. Applications capable of being controlled by the printed component information within the production operation include, but are not limited to, automatic production initial set-up verification, automatic production feed change set-up verification, feeder performance verification, material monitoring including automatic backflushing and stock check/work-in-process cycle counting, and production system control.

Typically, during initial set-up of a production run, a manual verification procedure is used in which barcoded information affixed to the side of component reels is scanned using a hand-held scanning unit at the time the component reel or kit is loaded on the placement machine. This, however, introduces human error into the production process because, while the barcode is scanned correctly, the component reel may be loaded onto the wrong placement machine or in the wrong position on the placement machine. The potential for error introduction may also be introduced when an operator chooses not to scan a component reel during set-up. These errors allow wrong feeds into the production process.

Figure 6:
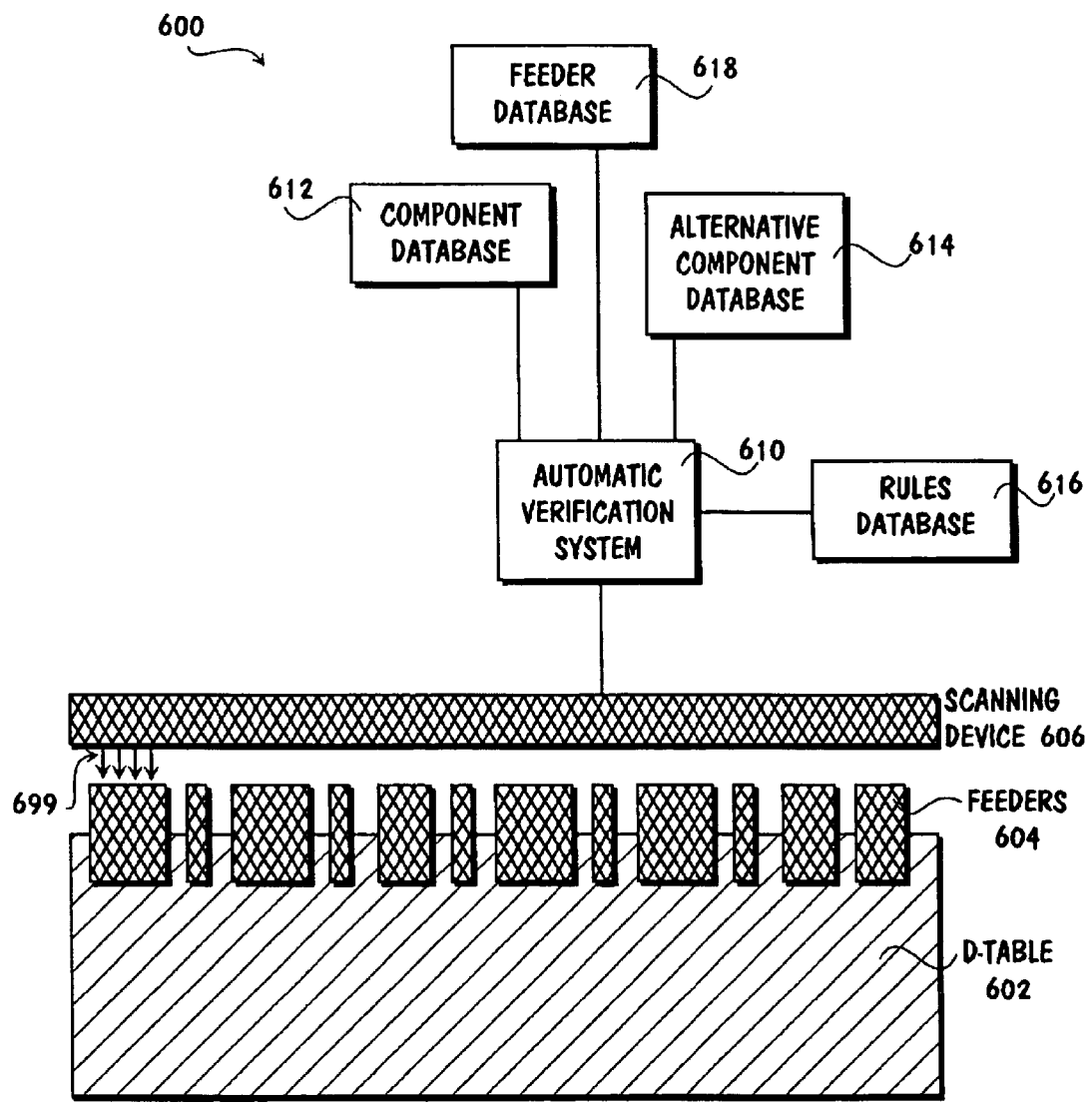
FIG. 6 is block diagram of a surface-mount device (SMD) machine capable of using the printed information on a component tape of an embodiment for automatic production set-up verification.
Figure 7:
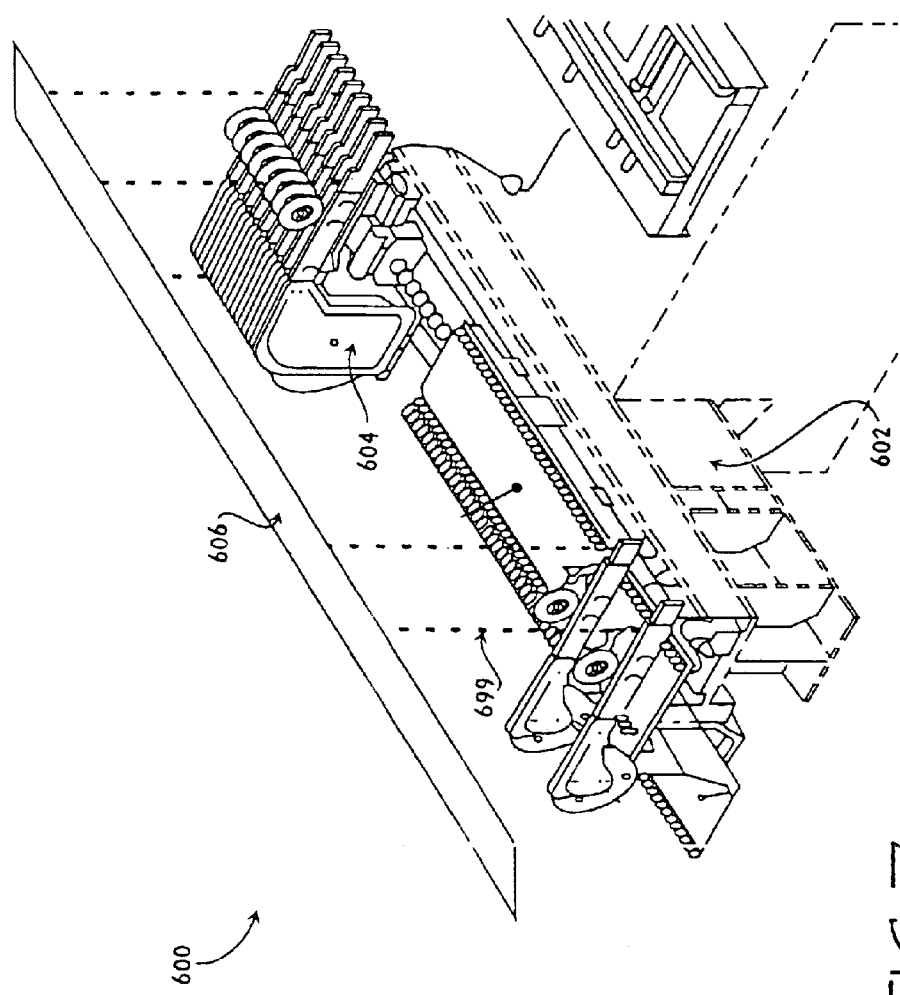
FIG. 7 is an alternate view of an SMD machine of an embodiment for automatic production set-up verification.

Automatic scanning and verification of component tapes, however, prevents human error in the production line from resulting in errors in the products produced. FIG. 6 is block diagram of an SMD machine 600 capable of using the printed information on a component tape of an embodiment for automatic production set-up verification. FIG. 7 is an alternate view of an SMD machine 600 of an embodiment for automatic production set-up verification.

The SMD machine 600 of an embodiment comprises a device table (D-table) 602, feeders 604, and a scanning device 606. The scanning device 606 is capable of electronically scanning 699 the component tapes provided by the feeders 604, and is positioned to perform such scanning 699. The SMD machine 600 is also coupled to an automatic verification system 610. The automatic verification system 610 of an embodiment includes a component database 612, an alternative component database 614, a rules database 616, and a feeder database 618.

In an alternate embodiment, the automatic verification system 610 is coupled to a host system (not shown) that includes the component database 612, alternative component database 614, rules database 616, and feeder database 618. In another alternate embodiment, the automatic verification system 610 is coupled to multiple host systems (not shown) that, using some combination of the host systems, include the component database 612, alternative component database 614, rules database 616, and feeder database 618. The automatic verification system 610, as well as any of the host systems, may comprise a personal computer (PC), but is not so limited. The coupling between the automatic verification system 610 and any host systems may be via wired network, wireless network, or some combination of wired and wireless network.

Figure 8:
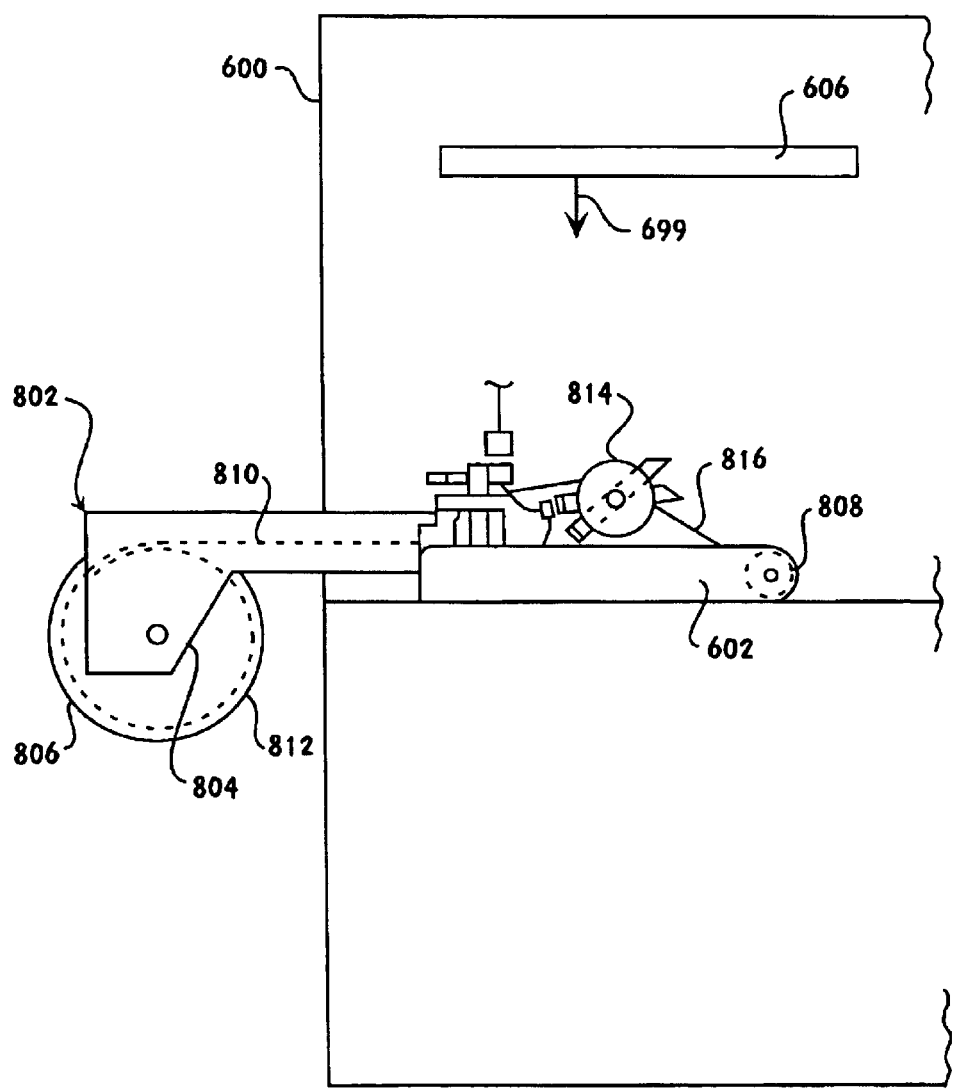
FIG. 8 is a side elevation view of an SMD machine of an embodiment for automatic production set-up verification.

FIG. 8 is a side elevation view of an SMD machine 600 of an embodiment for automatic production set-up verification. The SMD machine 600 includes a parts cassette 802, or component feeder, set on the D-table 602. The parts cassette 802 serves as the parts supply device of an embodiment. The parts cassette 802 includes a component reel mounting section 804 provided in the rear portion of the unit for rotatably mounting a component reel 806 on the parts cassette 802. A feeding section 808 intermittently feeds a carrier tape 810 of the unit 812 so as to sequentially move each of the parts carried by the carrier tape 810 to a parts removing position. A winding section 814 is positioned at a rear portion of the feeding section 808 and winds a cover tape 816 of the unit 812. The scanning device 606 is positioned to scan 699 and read printed information from the component tape 810 as the component tape 810 advances.

In the operation of the SMD machine 600 of an embodiment, the printed information on the component tape 810 is exposed at the end of each feeder 802 when the component reel 806 is loaded onto the feeder 802. The scanning device 606 scans and reads the printed information from each component tape loaded onto each feeder 802 of each D-table position. The scanned information is transferred, using a network, to the automatic verification system 610 where the information is used to verify the correct feed against the correct D-table position. The network may be a wired network, a wireless network, or a combination of wired and wireless networks. Any set-up errors are signalled by an alarm and an instruction for the operator to correct the set-up. The production operation is inhibited until the correct set-up is accomplished and verified. Thus, by scanning each component tape of each production position, the human error in the manual scanning of component-reel barcodes is eliminated.

The automatic verification system 610 includes a component database 612, an alternative component database 614, a rules database 616, and a feeder database 618, but is not so limited. Some combination of the databases 612–618 and interaction among the databases 612–618 of the automatic verification system 610 is used to verify the correct production set-up, control production resources, and maintain, control, and track a component inventory, as described herein.

The component database 612 provides a database of suitable components for each component part and each component production position. The scanned information is used by the automatic verification system 610 and the component database 612 to verify the correct feed against the correct D-table position. Set-up errors are signaled by an alarm and an instruction for the operator to correct the set-up. The production operation is inhibited until the correct set-up is accomplished and verified. Furthermore, if an error is detected when comparing the scanned information against information of the component database 612, the automatic verification system 610 may compare the scanned information against the information of the alternative component database 614.

The automatic verification system 610 of an embodiment includes an alternative component database 614 that provides a database of suitable alternative components for each component part. Upon scanning a component tape and recognizing that the component tape does not contain the preferred components called for at that production position by the production records, the automatic verification system 610 accesses the alternative component database 614 to determine if the component tape loaded contains suitable alternative components. The information contained in the alternative component database 614 is used as a flame of reference by the automatic verification system 610 to verify equivalent components. If the component tape is not verified as containing primary or alternative components, the production process is blocked by the automatic verification system 610.

In the event that an equivalent component is not in the alternative component database 614, a manual confirmation may be made by an individual, whereupon the verifying individual scans their identification badge barcode into the system. The identification badge barcode is used by the automatic verification system 610 to verify that the confirming individual is authorized to make such a confirmation. Upon such authorization, the production block placed by the automatic verification system 610 is overriden and production is allowed to commence or continue. As a result of the alternative component database 614, the time required for a set-up or product changeover is reduced by eliminating the manual verification of alternative component tolerance and specification values.

The automatic verification system 610 of an embodiment also includes a rules database 616. The rules database 616 contains rules or conditions upon which commencing or continuing production depend. For example, a printed circuit board (PCB) is due to change revision as a result of a change associated with two components of the PCB. While the two responsible components are not changing tolerance or value, they are only to be sourced from a particular vendor for the new revision. The automatic verification system 610 is programmed to accept only components from the specified vendor at the associated D-table positions during production runs of this version of the PCB.

During a mid-run feed change operation, the printed information on the component tape serves many useful functions, including advance warning of material exhaustion, a reduction in the amount of material stored on the production floor, and feed change component verification. In providing advance warning, scanning and monitoring of the quantity information during production runs allows for a programmable advance warning regarding when material will be exhausted on a particular feeder. The amount of time programmed for the warning can be programmed to correspond to the typical time required to locate and transport the additional component tapes. This minimizes lost production time.

Providing the quantity information to material stores may also result in a reduction in the amount of material stored on the production floor. The automatic verification system 610 can continuously track the quantity of material used at each D-table position during a production run. The average run-rate of a position is used to calculate an approximate time that a particular component part is projected to run out in production, and stores is notified of this approximate time, along with the production line and the D-table position. This allows stores to transact the required material from a stores location into work in process (WIP) for use in production. This allows for a reduction in the volume of the WIP by eliminating the requirement to store large quantities of material on the production floor.

As in initial set-up verification, the automatic verification system 610 is used to verify that a feed change is properly accomplished during a production run. As component tapes are exhausted during a production run, the production run is temporarily halted while the exhausted component tapes are replaced. The replacement component tapes are verified using the feed change verification to ensure that the exhausted component tapes are replaced with component tapes containing the correct components or appropriate equivalent components in the correct feeder position prior to resuming the production run. Also, the system provides very useful information on vendor quality and allows for the identity and isolation of problem components and packaging issues.

An embodiment of the automatic verification system 610 includes a feeder verification component for monitoring feeder performance. The feeder verification component includes a feeder database 618 coupled to the automatic verification system 610. The feeder database 618 is used to aid feeder maintenance and ensure that malfunctioning feeders are removed from the production operation.

In performing feeder verification, each feeder is identified using a barcode. A feeder database 618 is created that includes information on the feeders of the production process, including maintenance records, performance history, and product production history. During production runs, the automatic verification system 610 identifies each feeder using the feeder barcode and notifies production of the identity and position of any feeders having a high rate of attrition. A record of feeder performance may be automatically created by the automatic verification system 610 in the feeder database 618 or, alternatively, in a production records database. The poorly performing feeder is replaced, and automatically logged to feeder maintenance with a description of the fault. A placement machine will not accept a feeder tagged as a poorly performing feeder until it has been deleted from the feeder maintenance records, thereby creating a closed-loop feeder maintenance system.

In addition to the closed-loop feeder maintenance system, an advantage of the feeder verification component is that the maintenance history of every feeder is automatically tracked. Furthermore, trends and root causes of feeder damage are identified. Moreover, it helps to generate effective corrective actions as a result of data collected on the specific line, shift, operators, and equipment used.

The printed information on each component tape allows for exact material monitoring through automatic backflushing. This is accomplished by scanning the printed information on the component tape at the beginning of a production run to determine the quantity of material issued to the production run. A final scan is performed upon completion of the production run. The initial and final scans allow for the calculation of the exact quantity of material used during production. A comparison of the issued quantity of components with the production use quantities allows for automatic backflushing of the correct amount of material used to build the PCBs and for writing-off the exact quantity and type of attrition at the time of use.

Automatic backflushing provides many advantages over typical systems. The exact monitoring of production material means that assumptions do not have to be made regarding the quantity of components used by production to which estimated levels of attrition are added. A high level of material integrity is accomplished by accurately backflushing materials at the time of use. This overcomes the problems associated with out-of-sequence backflushing and manual backflush data gathered by operators. The automatic backflushing also eliminates the time consuming activity of countback and reduces the potential for error in the production system. Moreover, automatic tracking of the sequence of lot numbers of components issued to production allows for verification of the first-in-first-out inventory system. Additionally, exact material monitoring allows for better tracking of vendor quality issues through more accurate identification and tracking of problems identified in production.

The automatic backflushing system provided in an embodiment improves material accuracy to such an extent that annual stock checks and periodic WIP cycle counting may be eliminated. However, if a stock check is accomplished, the printed information on the component tape will increase the speed of the stock check process in the production area and eliminate inaccurate count methods like estimating and guaging component reel quantities. A stock check could be accomplished, with the printed information, using the D-table scanners to scan all component tapes in production positions. Alternatively, hand-held or portable scanners could be used to scan the component tape information. This would streamline the typical inventory process and cause minimal disruption to the production process. Furthermore, component reels would not have to be stripped from a feeder or taken from a trolley to be counted accurately. Consequently, there would be a reduced risk of attrition, incorrect feeding, or misplacement of material.

Furthermore, the cover tape printer is not limited to a backflushing process. The cover tape printer can be used with a work order process, in which the cover tape printer provides for a quick, simple, and accurate method of issuing exact quantities to be consumed by a work order. In this case, the material is transacted before the production run, rather than after the run, as in backflushing.

The scanning device 606 of an embodiment may be located over the D-table 602 or mounted to the D-table 602 so that the scanning device 606 has a view of the printed information on the component tape 810 as the component tape 810 is fed from the component reel 806. The scanning device 606 may span the length of the D-table 602 or may be movably mounted to scan the entire length of the D-table 602, but is not so limited. Moreover, the scanning device 606 may include one scanner servicing one feeder or one scanner servicing several feeders.

While the scanning device 606 of an embodiment is compatible with the reading and scanning technologies discussed herein, various embodiments may use different symbol scanning systems. While different symbol scanning systems are discussed herein, the embodiment is not so limited. One embodiment uses a self-adjusting adaptive scanning system including a scanner, responsive to coordinate control signals, for directing a light beam in a pattern at a symbol, for detecting a reflected portion of the light beam, and for generating feedback signals reflecting successful decodes. A microprocessor, responsive to the feedback signals, generates pattern control signals, and a pattern generator generates coordinate control signals in response to the pattern control signals to select a desirable light beam pattern.

An alternate embodiment uses an optical scanner for reading symbologies at variable depths of field. The scanning device has a light source for projecting emitted light toward the symbol image to be reflected back to an optical assembly, or zoom lens. The zoom gives multiple field of view capability to a CCD detector for detecting the reflected light, and generating a proportional electrical signal. The sensor is aimed for reading the symbology by a frame locator including a light source that emits a beam divided by diffractive optics into beamlets matching the dimensions of the respective field of views. Refractive optics are shifted in response to movement of the zoom lens for aiming the beamlets to form an aiming frame in accordance with the depth of field selected by the zoom lens. The device includes a microcomputer that communicates with a host computer including an application program interface library with downloadable applications for image processing, including, segmenting, analyzing, and decoding.

Another alternate embodiment uses a scanning system including an imaging camera to determine an orientation of a symbol on a scanned article. In response to determinations of a symbol location, orientation, size and type, the scanning system adjusts a scanning speed, shape, and orientation of the light beam pattern and a location of the light beam pattern. The resulting light beam is directed at the bar code symbol location and a signal corresponding to the reflected light beam portion is generated.

Moreover, another alternate embodiment includes a scanning system that first uses an aim mode to scan symbols using a scan pattern that is relatively small and dense. Thereafter, a second larger scan pattern is used for decoding. During aiming, the symbol is partially decoded to determine type and orientation, and this information is applied to control the angle of the scan pattern produced, the rate at which the scan pattern is increased for optimum decoding, and the ultimate pattern size.

Still another alternate embodiment uses a symbol scanning system that adaptively changes scanning system parameters including light beam pattern and focus to improve symbol readability. Furthermore, other alternate embodiments include scanners that produce scan lines of light along two axes of a symbol, and the resultant signals are processed for decoding the barcode in both axes.

A further alternate embodiment uses an infrared scanner system. The infrared scanner system reads an ink that is compatible with the infrared scanner, but is not so limited. Use of this system when scanning and reading from the component tapes eliminates any affects due to the background contrast and color.

Figure 9:
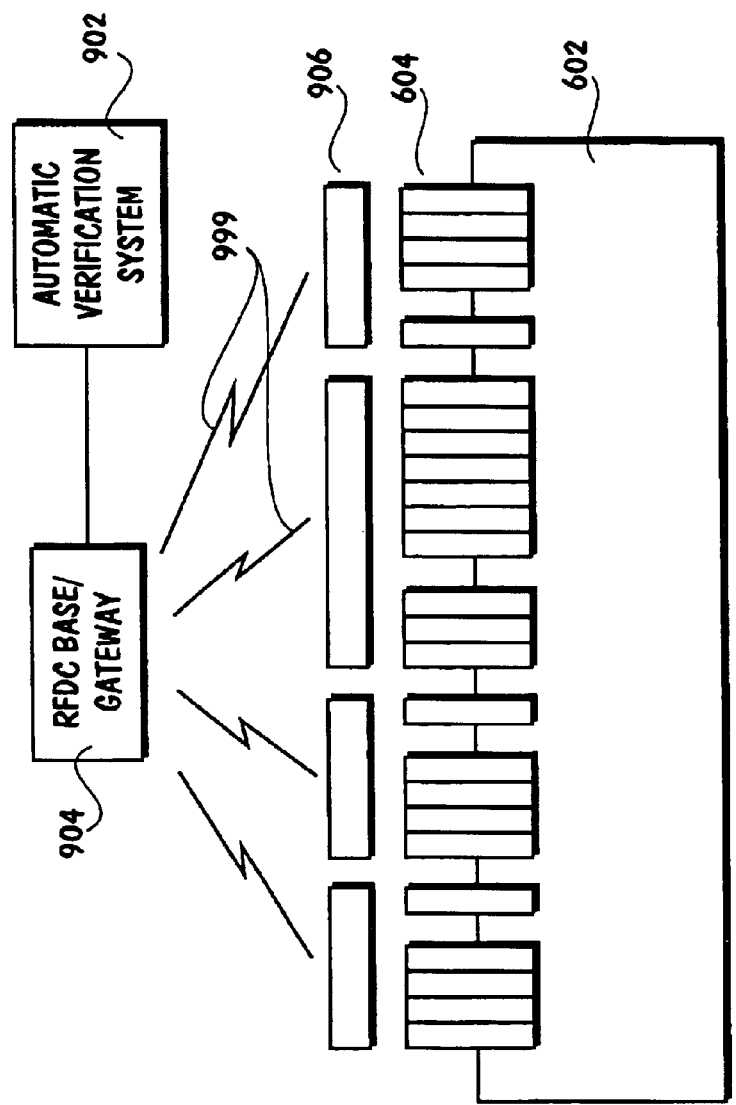
FIG. 9 is a block diagram of an SMD machine coupled to an automatic verification system of an embodiment using a Radio Frequency Data Communications (RFDC) system.

The SMD machine of an embodiment may be coupled to the automatic verification system using Radio Frequency Data Communications (RFDC) technology. FIG. 9 is a block diagram of an SMD machine 602–604 coupled to an automatic verification system 902 of an embodiment using a RFDC system 904–906. The RFDC system 904–906 includes radio frequency local area networks (LANs) and radio frequency wide area networks (WANs), but is not so limited. The RFDC system 904 of an embodiment may use narrow band, direct-sequence modulation spread spectrum, and frequency hopping spread spectrum communication techniques, but is not so limited.

The RFDC system 904–906, as enabling technology for AIDC implementations, uses wireless terminals 906 that include a radio transmitter and receiver, or transceiver, and a scanner. The wireless terminals 906 may also include a data entry device (not shown) and a display (not shown). The wireless terminals 906 support bidirectional communications 999 with at least one master radio transceiver, or base station or wireless gateway 904, which receives and routes messages from the individual wireless terminals 906 to a radio frequency network controller (not shown). The radio frequency network controller acts as a gateway for communications between a host computer and other components of the radio frequency system. The base station 904 may also route messages such as instructions and exceptions from a host system to the wireless terminals 906.

Depending on the system configuration, the network controller function may be subsumed by a host system. In one embodiment, the automatic verification system 902 serves as the host platform for the application program, database, network controller, and base station of the RFDC system. In another alternate embodiment, the host system subsumes the automatic verification system 902, wherein the host computer of the RFDC system serves as the host for the automatic verification system 902.

The base station 904 receives data from the wireless terminals 906 by means of polling or contention protocols. With polling, each wireless terminal 906 is polled or queried in a specific sequence. In a contention system, each wireless terminal 906 transmits on its own accord; if the channel is busy, the wireless terminal 906 retransmits after a specified set delay. The polling method is typically used for systems with few wireless terminals 906 and approximately uniform transaction rates. Systems with many wireless terminals 906 and high transaction rates achieve more consistent response rates with the contention method.

The radio frequency network controller, which may be a personal computer (PC), acts as the interface between the wireless terminal network and the host computer and/or data collection program. The controller may interface via wire with an autonomous host, or the controller may be the host where the data collection program or database resides.

Repeaters or multiple base stations may be used, depending on the size and layout of a production facility, to assure complete radio coverage.

The RFDC system of an embodiment uses a client/server approach. The client/server approach provides each wireless terminal with a network driver, thereby, allowing access to the network so that the each wireless terminal can communicate directly with the host or any other available application. The client/server architecture provides fast response rates because the data collection program does not have to run on the host as it would with terminal emulation.

Figure 10:
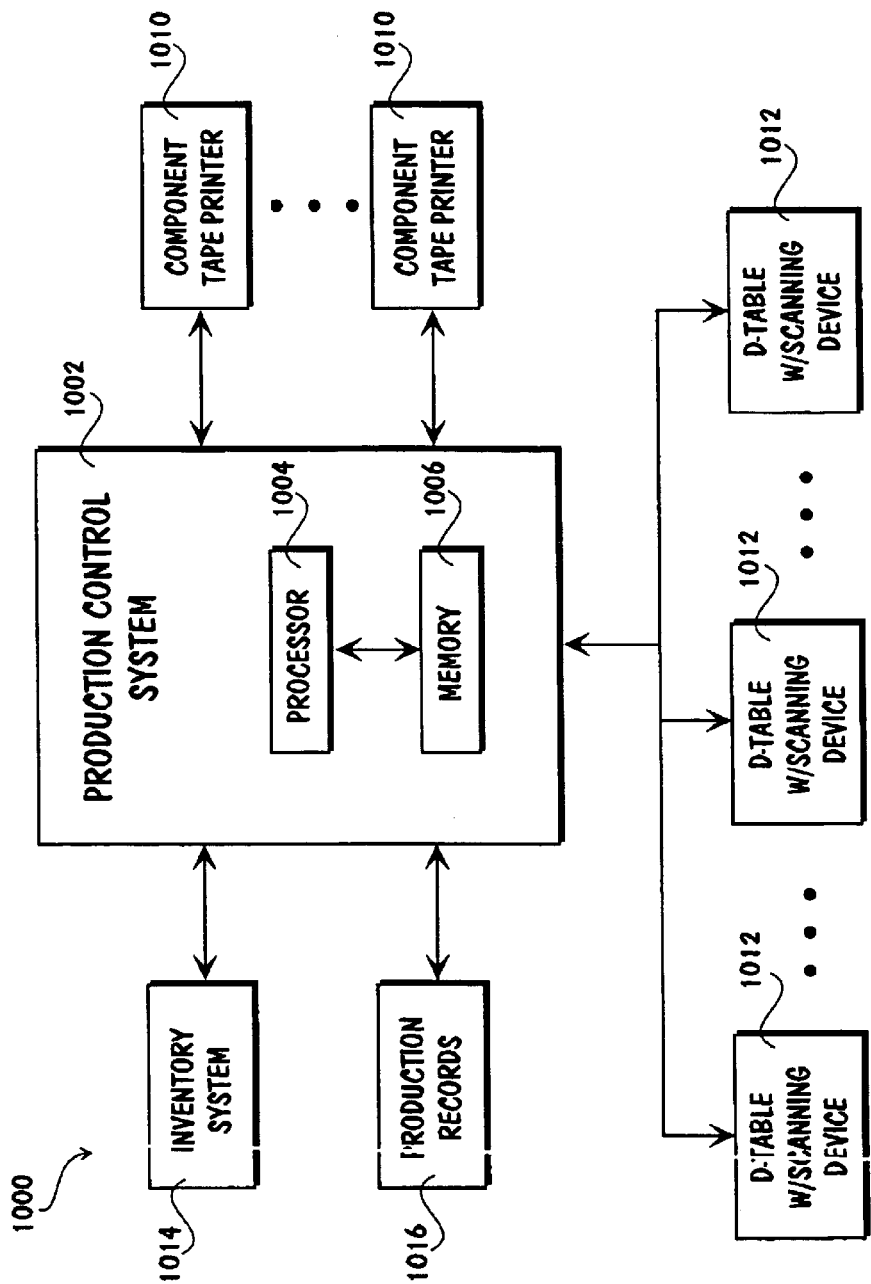
FIG. 10 is a block diagram of a production control system of an embodiment controlling equipment of a production facility using the information printed at intervals along a component tape.

FIG. 10 is a block diagram of a production control system 1002 of an embodiment controlling equipment of a production facility 1000 using the information printed at intervals along a component tape. The production control system 1002 includes at least one processor 1004 coupled to at least one memory device 1006. The processor 1004 and memory device 1006 are coupled to receive information from and provide control information to at least one component 1010–1016 of a production operation or facility 1000. The components of the production operation 1000 include, but are not limited to, at least one component tape printer device 1010 described herein, at least one device table (D-table) with a scanning device 1012, or SMD machine as described herein, an inventory system or database 1014, and a production records system or database 1016. The production control system 1002 may be located at the production facility 1000 or it may be located at a different location. A production control system 1002 located at a location different from the production facility may be coupled to the components of the production facility using a wired network, a wireless network, or some combination of a wired and a wireless network.

The production control system 1002 of an embodiment is coupled to receive information from the component tape printers 1010 including the number of components on a component tape, part number, tolerance and value description, batch number, lot number, component manufacturer, component vendor, and component reel information, as described herein. The information from the component tape printers 1010 is used to update the inventory and material tracking system. The information from the component tape printers 1010 may be received by the production control system 1002 at the time the component tape is counted and printed, or at a time subsequent to the counting and printing operation. The information received from the component tape printers 1010 may be stored in a database for later retrieval and use or may be stored using a temporary buffer or register storage for more immediate use.

When a component tape is loaded into a feeder position on a D-table, the scanning device scans and reads the component tape and provides the scanned information to the production control system 1002. The production control system 1002 uses this information to correlate the components of the scanned component tape to associated database information for the component tape, database information including that gathered during the counting and printing operation associated with the particular component tape by the component tape printer. Furthermore, the production control system 1002 uses the scanned information to verify that the correct component tape is loaded at the proper position for the programmed production, operation that is being set-up or is in process, as described herein. The production control system 1002 may simultaneously monitor and control numerous pieces of production equipment at numerous production positions throughout the production facility using the information scanned from numerous component tapes at numerous production positions.

In the operation of the production control system 1002 of an embodiment, the printed information on the component tape is exposed at the end of each D-table feeder when the component reel is loaded onto the feeder. The scanning device scans and reads the printed information from each loaded component tape. The scanned information is transferred using a network to the production control system 1002 where the information is used to verify the correct feed against the correct D-table position. Any errors are signalled by an alarm and an instruction for the operator to correct the set-up. The production operation is inhibited until the correct set-up is accomplished and verified.

As during a production run, the production control system 1002 monitors and controls the production operation by electronically reading printed information from the component tapes as the component tapes are run through the feeders at the respective D-table positions. This printed information is transmitted to the production control system 1002 where it is used to track and control inventory and inventory movement, as described herein.

The production control system 1002 of an embodiment also includes a component database, an alternative component database, a rules database, and a feeder database. In an alternate embodiment, the production control system is coupled to a host system that includes the component database, alternative component database, rules database, and feeder database. In another alternate embodiment, the production control system is coupled to multiple host systems that, among some combination of the host systems, include the component database, alternative component database, rules database, and feeder database.

The component database provides a database of suitable components for each component part and each component production position. The scanned information is used by the production control system 1002 and the component database to verify the correct feed against the correct D-table position. Any set-up errors are signalled by an alarm and an instruction for the operator to correct the set-up. The production operation is inhibited until the correct set-up is accomplished and verified. Furthermore, if an error is detected when comparing the scanned information against information of the component database, the production control system 1002 may compare the scanned information against the information of the alternative component database.

The production control system 1002 of an embodiment includes a database of suitable alternative components to each component part. Upon scanning a component tape and recognizing that the component tape does not contain the preferred components called for at that production position by the production records, the production control system 1002 accesses the database of alternatives to determine if the component tape loaded contains suitable alternative components. The information contained in the database of alternatives is used as a frame of reference by the production control system 1002 to verify equivalent components. If the component tape is not verified as containing primary or alternative components, the production process is blocked by the production control system 1002.

The production control system 1002 of an embodiment also includes a rules database. The rules database contains rules or conditions upon which commencing or continuing production depend. The production control system 1002 is programmed to allow production runs to proceed when the applicable rules or conditions are satisfied.

During a mid-run feed change operation, the printed information on the component tape serves many useful functions, including advance warning of material exhaustion, a reduction in the amount of material stored on the production floor, and feed change component verification. In providing advance warning, scanning and monitoring of the quantity information during production runs allows for a programmable advance warning regarding when material will be exhausted on a particular feeder. The amount of time programmed for the warning can be programmed to correspond to the typical time required to locate and transport the additional component tapes. This minimizes lost production time.

As in initial set-up verification, the production control system 1002 is used to verify that a feed change is accomplished correctly during a production run. As component tapes are exhausted during a production run, the production run is temporarily halted by the production control system 1002 while the exhausted component tapes are replaced. The new component tapes are verified using the feed change verification to ensure that the exhausted component tapes are replaced with component tapes containing the correct components or appropriate equivalent components in the correct feeder position prior to resuming the production run. Also, the system provides very useful information on vendor quality and allows for the identity and isolation of problem components and packaging issues.

An embodiment of the production control system 1002 includes a feeder verification component for monitoring feeder performance. The feeder verification component includes a feeder database coupled to the production control system 1002. The feeder database is used to aid feeder maintenance and ensure that malfunctioning feeders are removed from the production operation.

In performing feeder verification, each feeder is identified with a barcode. A feeder database is created that includes information on the associated feeder, including maintenance records, performance history, and product production history. During production runs, the production control system 1002 identifies each feeder using the feeder barcode and notifies production of the identity and position of any feeders having a high rate of attrition. The poorly performing feeder is replaced, and automatically logged to feeder maintenance with a description of the fault. A placement machine will not accept a feeder tagged as a bad feeder until it has been deleted from the feeder maintenance records, thereby creating a closed-loop feeder maintenance system.

Figure 11:
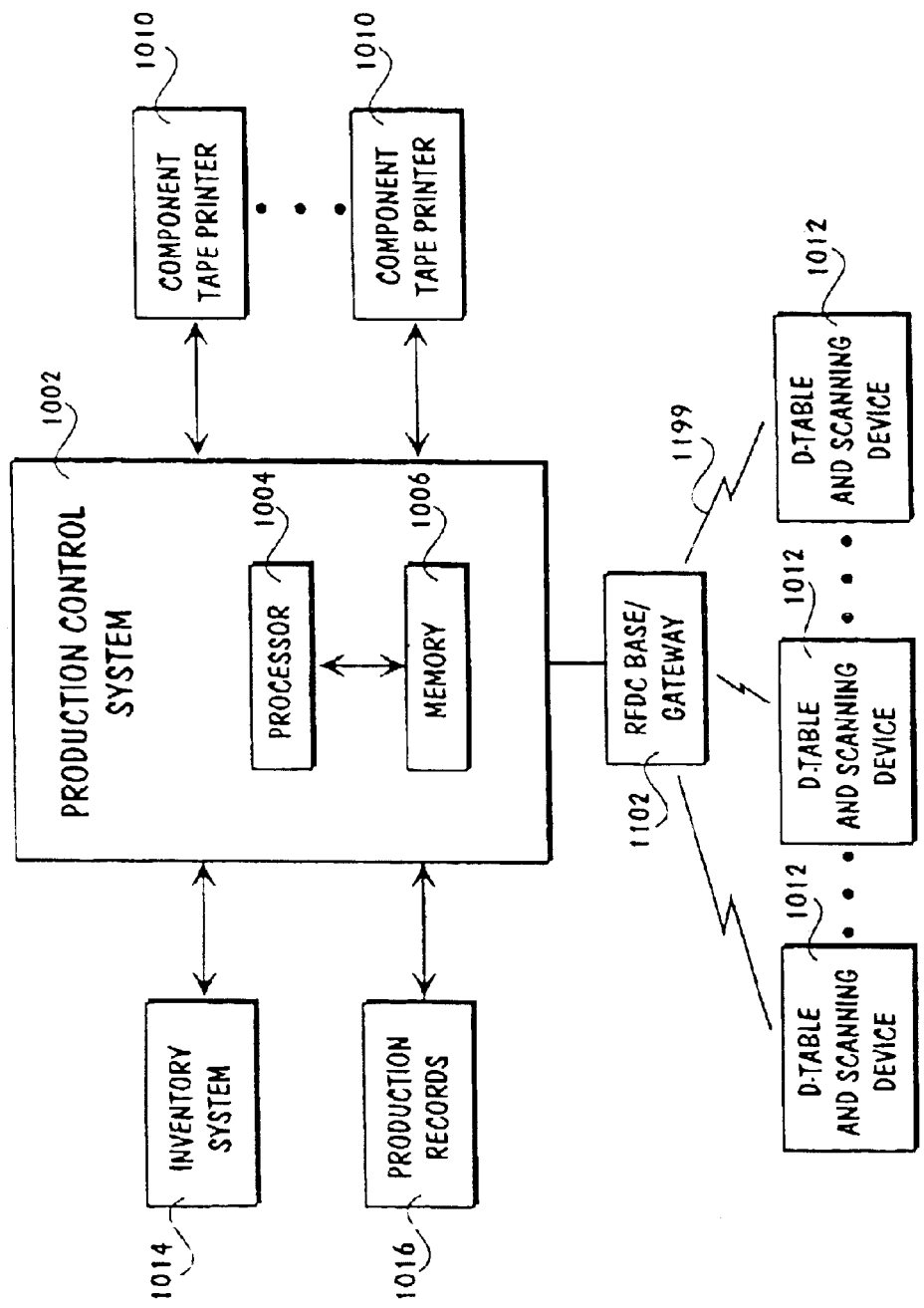
FIG. 11 is a block diagram of a device table (D-table) and scanning device coupled to a production control system of an embodiment using a RFDC system.

The D-table scanning device 1012 of an embodiment may be coupled to the production control system 1002 using a Radio Frequency Data Communication (RFDC) system, as described herein. FIG. 11 is a block diagram of a D-table and scanning device 1012 coupled to a production control system 1002 of an embodiment using a RFDC system. The RFDC system may be used in a radio frequency local area network (LAN) or a radio frequency wide area network (WAN), but is not so limited.

The RFDC system, as enabling technology for AIDC implementations, uses wireless terminals that include a radio transmitter and receiver, or transceiver, and a scanner that is integrated or co-located with the D-table to receive information therefrom. The wireless terminals support bidirectional communications 1199 with at least one master radio transceiver 1102, or base station or wireless gateway, which receives and routes messages from the individual wireless terminals to a radio frequency network controller (not shown). The radio frequency network controller acts as a gateway for communications between a host computer and other components of the radio frequency system. However, depending on the host system, a network controller may not be used. In one embodiment, the production control system 1002 serves as the host system for the application program, database, network controller, and base station of the RFDC system. In another alternate embodiment, the host computer of the RFDC system is the host for the production control system 1002.

Figure 12:
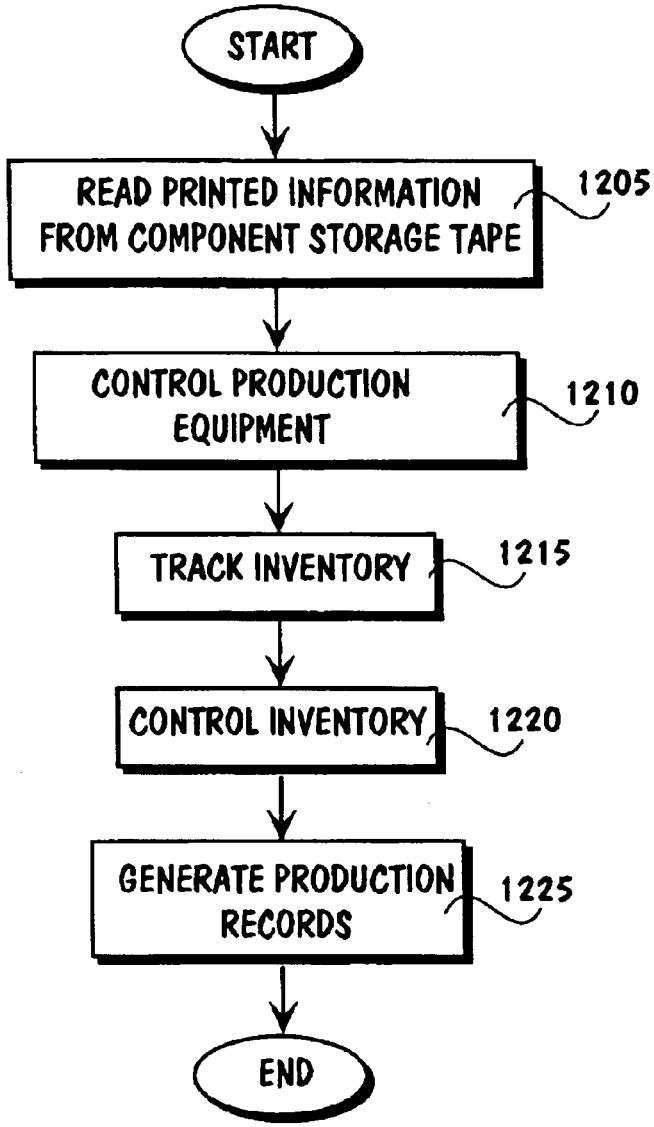
FIG. 12 is a flowchart of a method for controlling a production operation of an embodiment.

FIG. 12 is a flowchart 1200 of a method for controlling a production operation of an embodiment. Operation begins at step 1205, at which printed information is electronically scanned and read at intervals along a component tape. The printed information may be continuously scanned and read from the carrier tape portion or the cover tape portion of the component tape as components are removed from the component tape during production. In a production facility, many component tapes are scanned and read simultaneously, and the data from each tape is transmitted to a production control system. Processing of the data accumulated from the component tapes is performed at the production control system. The data processed from the printed information is used to automatically control at least one piece of production or assembly line equipment, at step 1210. The data processed from the printed information is used to automatically track, at step 1215, and control, at step 1220, a component inventory. Production records are generated, at step 1225, using the data processed from the printed information on the component tape.

Although the invention has been described in terms of preferred embodiments, it will be understood that numerous variations and modifications may be made without departing from the spirit and scope of the present invention as described herein and as set forth in the accompanying claims.

What is claimed is:

1. A method for controlling a production operation, comprising: electronically reading printed information from at least one component tape at intervals along the at least one component tape, wherein the printed information includes a count of at least one electronic component, the count indicating a position of the at least one electronic on the component tape; and automatically controlling at least one production device using the printed information by verifying a correct production set-up, wherein the step of verifying a correct production set-up includes verifying components of at least one production position by accessing a component database, verifying equivalent components of the at least one production position from an alternative component database, verifying that at least one rule is satisfied using a rule database, and inhibiting production upon detection of an incorrect production set-up.

2. The method of claim 1, further comprising verifying that at least one rule is satisfied using the printed information.

3. The method of claim 1, further comprising:
providing at least one advance notice of when material will be exhausted for the at least one production position; tracking an inventory of the at least one electronic component using the printed information; controlling the inventory using the printed information; and generating production records using the printed information.

4. The method of claim 1, further comprising transferring the electronically read printed information using a Radio Frequency Data Communications (RFDC) system.

5. The method of claim 1, further comprising:
eletronically reading printed feeder information off of at least one feeder; electronically identifying the at least one feeder; and determining that the at least one feeder is fit for operation using information of at least one feeder database.

6. The method of claim 1, wherein the printed information further comprises at least one item selected from a group comprising part number, tolerance and value description, batch number, lot number, component manufacturer, and component vendor, and wherein the printing comprises at least one type selected from a group comprising alphanumeric characters and Automatic identification and Data Capture (AIDC) technologies, and wherein the printing, is produced using at least one method selected from a group comprising printing, ink jet printing, laser etching, and imaging.

7. The method of claim 1, wherein the AIDC technologies comprise one-dimensional barcodes, two-dimensional barcodes, three-dimensional barcodes, composite symbology, and Reduced Space Symbology barcodes.

8. The method of claim 1, wherein the electronic reading comprises scanning and reading using at least one technology selected from a group comprising Optical Character Recognition (OCR), Optical Mark Recognition (OMR), Magnetic Ink Character Recognition (MICR), infrared scanning, and machine vision, wherein the machine vision technology uses at least one vision subsystem selected from a group comprising linear imagers, laser imagers, and charge coupled device (CCD) cameras.

9. The method of claim 1, wherein electronically reading printed information comprises scanning and reading printed information on at least one cover tape of the at least one component tape.

10. The method of claim 1, wherein electronically reading printed information comprises scanning and reading printed information on at least one carrier tape of the at least one component tape.

11. A system for controlling a production operation, the system comprising at least one processor coupled to at least one memory device and at least one production device, the system capable of monitoring and controlling the production operation by: electronically reading printed information from at least one component tape at intervals along the at least one component tape, wherein the printed information includes a count of at least one electronic component, the count indicating a position of the at least one electronic component on the component tape; and automatically controlling at least one production device using the printed information by verifying a correct production set-up, wherein the step of verifying a correct production set-up includes verifying components of at least one production position by accessing a component database, verifying equivalent components of the at least one production position from an alternative component database, verifying that at least one rule is satisfied using a rule database, and inhibiting production upon detection of an incorrect production set-up.

12. The system of claim 11, wherein the system is further capable of monitoring and controlling the production operation by transferring the electronically read printed information using a Radio Frequency Data Communications (RFDC) system.

13. The system of claim 11, further comprising at least one feeder database, wherein automatically controlling includes electronically identifying at least one feeder and determining that the at least one feeder is fit for operation using the at least one feeder database.

14. The system of claim 11, wherein the system is further capable of monitoring and controlling the production operation by:

providing at least one advance notice of when material will be exhausted for the at least one production position; tracking an inventory of the at least one electronic component using the printed information; controlling the inventory using the printed information; and generating production records using the printed information.

15. The system of claim 11, wherein the printed information further comprises at least one item selected from a group comprising part number, tolerance and value description, batch number, lot number, component manufacturer, and component vendor, and wherein the printing comprises at least one type selected from a group comprising alphanumeric characters and Automatic Identification and Data Capture (AIDC) technologies, and wherein the printing is produced using at least one method selected from a group comprising printing, ink jet printing, laser etching, and imaging.

16. The system of claim 11, wherein the AIDC technologies comprise one-two-dimensional barcodes, three-dimensional barcodes, composite dimensional barcodes, symbology, and Reduced Space Symbology barcodes, wherein the electronic reading comprises scanning and reading using at least one technology selected from a group comprising Optical Character Recognition (OCR), Optical Mark Recognition (OMR), Magnetic Ink Character Recognition (MICR), infrared scanning, and machine vision, wherein the machine vision technology uses at least one vision subsystem selected from a group comprising linear imagers, laser imagers, and charge coupled device (CCD) cameras.

17. The system of claim 11, wherein electronically reading printed information comprises scanning and reading printed information on at least one cover tape of the at least one component tape.

18. The system of claim 11, wherein electronically reading printed information comprises scanning and reading printed information on at least one carrier tape of the at least one component tape.

19. A computer readable medium containing executable instructions which, when executed in a processing system, causes the system to control a production operation, the controlling comprising:

electronically reading printed information from at least one component tape at intervals along the at least one component tape, wherein the printed information includes a count of at least one electronic component, the count indicating a position of the at least one electronic component on the component tape; and automatically controlling at least one production device using the printed information by verifying a correct production set-up, wherein the step of verifying a correct production set-up includes verifying components of at least one production position by accessing a component database, verifying equivalent components of the at least one production position from an alternative component database, verifying that at least one rule is satisfied using a rule database, and inhibiting production upon detection of an incorrect production set-up.

20. The computer readable medium of claim 19, wherein the controlling further comprises: providing at least one advance notice of when material will be exhausted for the at least one production position; tracking an inventory of the at least one electronic component using the printed information; controlling the inventory using the printed information; and generating production records using the printed information.

21. The computer readable medium of claim 19, wherein the printed information further comprises at least one item selected from a group comprising part number, tolerance and value description, batch number, lot number, component manufacturer, and component vendor, and wherein the printing comprises at least one type selected from a group comprising alphanumeric characters and Automatic Identification and Data Capture (AIDC) technologies, and wherein the printing is produced using at least one method selected from a group comprising printing, ink jet printing, laser etching, and imaging.

22. The computer readable medium of claim 19, wherein the AIDC technologies comprise one-dimensional barcodes, two-dimensional barcodes, three-dimensional barcodes, composite symbology, and Reduced Space Symbology barcodes, wherein the electronic reading comprises scanning and reading using at least one technology selected from a group comprising Optical Character Recognition (OCR), Optical Mark Recognition (OMR), Magnetic Ink Character Recognition (MICR), infrared scanning, and machine vision, wherein the machine vision technology uses at least one vision subsystem selected from a group comprising linear imagers, laser imagers, and charge coupled device (CCD) cameras.

23. The computer readable medium of claim 19, wherein electronically reading printed information comprises scanning and reading printed information on at least one cover tape of the at least one component tape.

24. The computer readable medium of claim 19, wherein electronically reading printed information comprises scanning and reading printed information on at least one carrier tape of the at least one component tape.

25. An electromagnetic medium containing executable instruction which, when executed in a processing system, causes the system to control a production operation, the controlling comprising:

electronically reading printed information from at least one component tape at intervals along the at least one component tape, wherein the printed information includes a count of at least one electronic component, the count indicating a position of the at least one electronic component on the component tape; and automatically controlling at least one production device using the printed information by verifying a correct production set-up, wherein the step of verifying a correct production set-up includes verifying components of at least one production position by accessing a component database, verifying equivalent components of the at least one production position from an alternative component database, verifying that at least one rule is satisfied using a rule database, and inhibiting production upon detection of an incorrect production set-up.

26. The electromagnetic medium of claim 25, wherein the controlling further comprises: providing at least one advance notice of when material will be exhausted for the at least one production position; tracking an inventory of the at least one electronic component using the printed information; controlling the inventory using the printed information; and generating production records using the printed information.

27. The electromagnetic medium of claim 25, wherein the printed information further comprises at least one item selected from a group comprising part number, tolerance and value description, batch number, lot number, component manufacturer, and component vendor, and wherein the printing comprises at least one type selected from a group comprising alphanumeric characters and Automatic Identification and Data Capture (AIDC) technologies, and wherein the printing is produced using at least one method selected from a group comprising printing, ink jet printing, laser etching, and imaging.

28. The electromagnetic medium of claim 25, wherein the AIDC technologies comprise one-dimensional barcodes, two-dimensional barcodes, three-dimensional barcodes, composite symbology, and Reduced Space Symbology barcodes, wherein the electronic reading comprises scanning and reading using at least one technology selected from a group comprising Optical Character Recognition (OCR), Optical Mark Recognition (OMR), Magnetic Ink Character Recognition (MICR), infrared scanning, and machine vision, wherein the machine vision technology uses at least one vision subsystem selected from a group comprising linear imagers, laser imagers, and charge coupled device (CCD) cameras.

29. The electromagnetic medium of claim 25, wherein electronically reading printed information comprises scanning and reading printed information on at least one cover tape of the at least one component tape.

30. The electromagnetic medium of claim 25, wherein electronically reading printed information comprises scanning and reading printed information on at least one carrier tape of the at least one component tape.

* * * * *